United States Patent [19]

Nichols, Jr.

[11] Patent Number: 4,518,646

[45] Date of Patent: May 21, 1985

[54] PRINTED CIRCUIT BOARD LAMINATE WITH ARC-RESISTANCE

[75] Inventor: Roy F. Nichols, Jr., Coshocton, Ohio

[73] Assignee: General Electric Company, Schenectady, N.Y.

[21] Appl. No.: 557,016

[22] Filed: Dec. 1, 1983

Related U.S. Application Data

[63] Continuation-in-part of Ser. No. 177,980, Aug. 14, 1980, , which is a continuation-in-part of Ser. No. 148,607, May 12, 1980, abandoned.

[51] Int. Cl.³ .............................................. H05K 1/00
[52] U.S. Cl. ................... 428/248; 174/68.5; 428/209; 428/211; 428/236; 428/249; 428/252; 428/264; 428/273; 428/901
[58] Field of Search ............... 174/68.5; 428/209, 211, 428/233, 236, 241, 242, 248, 249, 251, 252, 264, 265, 268, 272, 273, 901

[56] References Cited

U.S. PATENT DOCUMENTS

| | | | |
|---|---|---|---|
| 3,499,821 | 3/1970 | Zinbarg | 428/268 |
| 3,560,328 | 2/1971 | Anderson et al. | 428/249 |
| 4,031,313 | 6/1977 | Franz et al. | 428/209 |
| 4,034,136 | 7/1977 | Wright et al. | 428/901 |

*Primary Examiner*—John E. Kittle
*Assistant Examiner*—James J. Seidleck
*Attorney, Agent, or Firm*—Donald J. Voss

[57] ABSTRACT

A high voltage arc-resistant laminate for printed circuit boards comprising a substrate and metallic foil bonded on one or both surfaces of the substrate. The substrate includes core sheets of cellulosic paper impregnated with a resin formulation comprising an admixture of resin solids including a major amount of phenolic resins, and minor amount of curing agents for the resins, and face sheets of glass fiber cloth impregnated with a resin formulation consisting substantially entirely of brominated aromatic epoxy resin solids, and minor amount of dicyandiamide curing agent and amine catalyst along with, antimony oxide, thixotropic agent, and pigments. Also disclosed is a process for manufacturing the laminate. A high temperature resistant embodiment is also disclosed in which the core sheet resin is brominated aromatic epoxy instead of phenolic resin.

5 Claims, 2 Drawing Figures

PRINTED CIRCUIT BOARD LAMINATE WITH ARC-RESISTANCE

This application is a continuation-in-part of application Ser. No. 177,980, filed Aug. 14, 1980 which application was a continuation-in-part of application Ser. No. 148,607, filed May 12, 1980, now abandoned.

This invention relates to the manufacture of printed circuit board laminates which have commercially acceptable physical, chemical and electrical properties, but more particularly, have high voltage arc resistance.

While printed circuit board laminates are employed in the fabrication of many types of electrical circuits, this invention is particularly, but not exclusively, useful in the manufacture of printed circuit board laminates suited for fabrication into yoke circuits of T.V. tubes, where high voltages in excess of 2,000 volts may be encountered, by reason of their being resistant to the continuation of arcs formed in the surfaces of the boards by high voltages across open circuits.

With the manufacturing process of this invention, laminates can be produced at costs comparable to costs for producing laminates now in general use that do not provide the superior electrical properties required for such high voltages encountered in circuits such as T.V. yoke circuits. Laminates manufactured using this invention also have physical properties that permit the laminates to be fabricated into finished printed circuit boards by conventional methods using conventional tooling. This is important in that the superior electrical properties are not obtained with a trade-off of physical or chemical properties that would require changes in fabrication methods or machines that increase the cost of fabrication of finished printed circuit boards.

Printed circuit board laminates are conventionally manufactured as a substrate with metallic foil provided on one or both surfaces of the substrate. It is common to manufacture the substrate by preparing dry prepregs by impregnating cloth or paper with a solvent containing a phenolic resin system, drying the solvent and in place thereof partially polymerizing the resin to a B-stage to produce a low tack surface capable of cure by the subsequent application of heat. Dry prepregs may be prepared for both core and surface sheets, and such dry prepregs are then layered up with foil and subjected in a press to heat and pressure so as to cure the resins and bond the foil and substrate layers into a solid laminate. The laminates are initially made in large sheets by the laminate manufacturer, then die cut to the required board size and packed and shipped to the circuit manufacturer.

In the fabrication of printed circuit boards from laminates, the laminates are punched to provide holes for copper plating or for conductors connected to the foil on one or both laminate surfaces, and the foils are etched to provide conductors. The circuit components are assembled on and soldered to the metal foil conductors on the boards. In manufacture of the laminates or in the fabrication of the printed circuit boards from the laminates, during any one of the various pressing, cutting, punching, assembly, soldering or shipping steps involved in the total process, stresses on the boards or poor solder joints can cause hairline cracks or interruptions in the metal foil conductors or soldered connections on the printed circuit boards. When high voltages of several thousand volts are applied in a circuit, for example in yoke circuits of T.V. sets, arcing will occur at any such hairline cracks or interruptions. If the arc continues across a carbonized, electrically conductive path on the surface of the board, after the conductors are vaporized, the board will be ignited causing a fire in the set.

It is the principal object of this invention to provide a printed circuit board laminate that has high voltage arc resistance, and thus to provide a safer material for use in fabricating printed circuit boards having high voltages applied in the circuits.

It has been disclosed, in U.S. Pat. No. 4,031,313, that arc resistance of a circuit board laminate may be enhanced by incorporating a layer of arc-retardant resin between the metal foil and the circuit board substrate. Alternatively, the arc-retardant resin may be mixed with a thermosetting resin of the usual type used to produce the support for the metallic foil, and the mixture used for impregnating the reinforcing material of the surface layer of the laminate. The characteristics of the arc-retardant resin are that is does not become electrically conductive during the vaporization of a foil conductor in the arc, but retains a high insulation resistance, by preventing the formation of graphite-type carbon bridges which would maintain the arc, so that a possibly produced arc will be cut off and a board not ignited thereby. According to U.S. Pat. No. 4,031,313, essential major constituents of the arc-retardant layer are cross-linked thermosetting synthetic resins or crosslinkable elastomers, which contain no aromatic groups and no hetercyclic rings containing conjugated double bonds. According to the issued patent, when aromatic compounds and/or the heterocyclic compounds of the aforesaid type are heated in an arc, they are decomposed to graphite-like carbon bridges. Thus, when aromatic or heterocyclic ring-containing resins are mixed with arc-retardant resins, the proportion of the former should not exceed 30% by weight, because otherwise the effect according to U.S. Pat. No. 4,031,313 no longer occurs.

While this prior patent teaches that plastic material used for production of arc-resistant circuit board laminates must contain no more than 30% weight of these aromatic or heterocyclic ring-containing resins, it has now been found that certain of these aromatic or heterocyclic ring-containing resins may be used for the surface layers of circuit board laminates directly supporting metallic foil, when such resins are combined with selected fillers and other selected constituents and the process for manufacturing the laminates meets specified conditions, and the laminates so constructed will have superior arc-resistance to high voltages.

In testing laminates for arc-resistance, the test procedure described in U.S. Pat. No. 4,031,313 with reference to comb-shaped electrodes was substantially carried out on printed circuit board laminates constructed according to this invention. Comb-shaped electrodes were etched in the metallic foil on test laminates, the electrodes having the configuration of FIG. 1, in which the teeth of the combs have varying widths as shown. Leads from a color T.V. set yoke circuit were connected to the electrodes as indicated in FIG. 1, to provide a source of high voltage of about 1400 volts (over 2,000 volts peak) which is thus applied across the gap (0.008") separating the electrodes when the T.V. set is turned on. The tube provides a visual display of the test results. With the comb-shaped electrodes, and with gaps of that dimension, a bridging arc will be initiated by inserting a pointed metal probe in the gaps between the electrode teeth. If a conductive path is formed in the laminate at any of the sites of the bridging arcs, the specimen will burn and the picture tube will display a snow condition (or picture if the set is connected to an antenna); if the copper at the tips of the electrode teeth at the site of the bridging arcs is vaporized causing the gaps to open or widen, and no conductive path is formed in the surface of the laminate at any of the sites of the bridging arcs, the arcs will be interrupted and the picture tube will display a series of multi-colored lines running down the center of the tube, due to the discontinuity thus introduced into the horizontal deflection circuit for the tube. Hundreds of sample laminates embodying this invention and boards manufactured according to this invention in limited production quantities have been tested using the test procedure outlined above, with essentially a zero failure rate under this test used as a standard.

DESCRIPTION OF THE PREFERRED EMBODIMENTS

Figure 1:
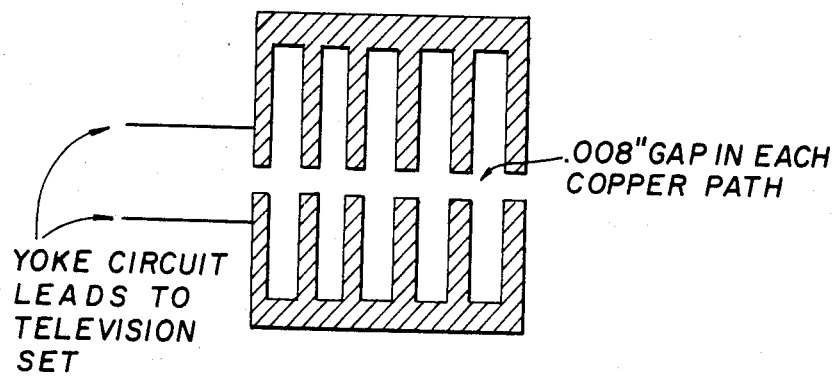
FIG. 1 is a diagram of comb-shaped electrodes used in the arc-resistance test.
Figure 2:
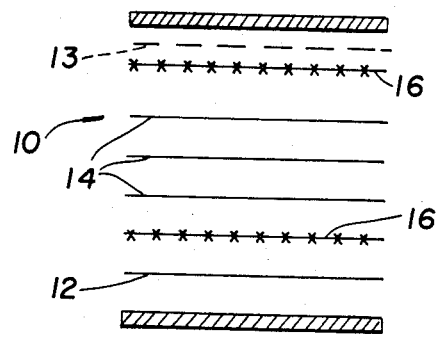
FIG. 2 is a schematic illustration of a lay-up and press plates for manufacturing a printed circuit board laminate.

As shown in FIG. 2, laminates manufactured according to the preferred embodiment of this invention comprise a substrate 10 with metallic foil 12, 13 provided on one or both outer surfaces of the substrate 10, and the substrate 10 having core sheets 14 of resin-impregnated paper and face sheets 16 of resin-impregnated glass fiber cloth.

It is conventional practice to employ phenolic and epoxy resins as the impregnating material for either face or core layers of printed circuit board laminates. In carrying out this invention an admixture of conventional phenolic resin and epoxy resin with fillers and other constituents is employed for impregnating the core sheets. The core sheets in the preferred embodiment of the invention, are cellulosic fiber paper (cotton linter fibers), and the preferred resin mixture for impregnating the paper sheets is set forth as "Core Resin" in Column 1 of Table 1 (the percentages in Table 1 are expressed as weight percent of a resin formulated from the designated constituents). This mixture contains known constituents, however, the particular constituents and proportions are selected to provide core sheets which in combination with the face sheets provide a substrate having superior physical, chemical and electrical properties.

Physical properties of the laminate consisting of foil and substrate may be shown by tests, e.g., strength and impact tests, and such physical properties are particularly important in providing circuit boards which may be punched and cut with ordinary tooling, and which will have the requisite strength to survive in the service intended. The chemical and electrical properties may also be shown by tests, e.g., flammability, dielectric constant, and surface resistivity, to determine whether the laminates will meet industry standards for the intended application. Such properties of laminates constructed according to the invention are shown in Column 1 of Table 2, which reveals that such laminates have properties required when intended for sale in the commercial market, in addition to enhanced arc resistance which is the primary object of the invention.

Turning now to the manufacture of laminates according to the invention, such laminates are made by preparing dry prepreg core sheets, dry prepreg face sheets, laying up an assembly of such sheets forming a substrate and foil, and curing the resin of the substrate. The preferred manufacturing process is as follows:

PREPARATION OF CORE SHEETS

The core sheets are made by first pre-wetting the cellulosic-based paper to 20 to 30 percent pick up in weight with either a water or an alcohol-water solution of a water-soluble phenolic, and then passing this pre-wet web directly into an impregnating tank containing the liquid impregnating resin, preferably a resin formulation set forth as "Core Resin" in Table 1, Column 1. The resin-impregnated sheets are passed through rolls to squeeze out excess resin, and are then passed through a drying oven at a temperature between 140°–160° to remove volatiles and cure the resin to a controlled "B" stage level. The resin content, including additives, of the dry paper prepreg ranges from 50 to 65 percent by weight.

It is believed important to control the flow characteristics, i.e., mobility of the impregnating resin in preparing the core sheets, by selection of the constituents of the core resin and the temperature and speed of the impregnating process. As shown in Table 1, and in keeping with the invention, the flow characteristics of the core resin should be between 7–22% as measured by the "Squeeze Out %", to restrict the tendency of the phenolic resin based core resin to bleed through to the surface of the face sheets.

TABLE 1

|  | Sample 1 | Sample 2 | Sample 3 | Sample 4 | Sample 5 | Sample 6 |
| --- | --- | --- | --- | --- | --- | --- |
| Face Sheets | 7628 Glass Fabric | 7628 Glass Fabric | 7628 Glass Fabric | 7628 Glass Fabric | Cotton Linters Paper [pre-coated with melamine] | 7628 Glass Fabric |
| Resin Content % | 48.9 | 48.9 | 48.7 | 45.5 | 63.2 | |
| Squeeze Out % | 7–22 | 24–28 | 26–30 | 23–28 | 26–28 | 7–30 |
| Face Resin | | | | | | |
| Epoxy Resin EEW = 400 19% Bromine Tetrabromobisphenol-A | 100 | 100 | 100 | 100 | 100 | 100 |
| Methyl Cellosolve | 6.8 | 6.8 | | 3.5 | | 6.8 |
| DMF | 6.8 | 6.8 | | 7.1 | | 6.8 |
| Dicyandiamide | 2 | 2 | | 2.1 | | 2.0 |
| TMG | 0.26 | 0.26 | | | | 0.26 |
| Fumed Silicon Dioxide | 0.7 | 0.7 | 0.96 | 0.7 | | 0.7 |
| Green Pigment | | 0.7 | | 0.31 | | |
| Antimony Oxide | 1.4 | 1.4 | 4.6 | | 6.8 | |
| Hydrous Aluminum | | 8.5 | | | | |

TABLE 1-continued

|  | Sample 1 | Sample 2 | Sample 3 | Sample 4 | Sample 5 | Sample 6 |
|---|---|---|---|---|---|---|
| Silicate |  |  |  |  |  |  |
| Brown Pigment | 0.2 |  |  |  |  |  |
| White Pigment | 0.8 |  |  |  |  |  |
| Acetone |  |  | 12.5 | 10.6 | 25.6 |  |
| Trimellitic Anhydride |  |  | 12 |  | 10.2 |  |
| Benzyldimethylamine (BDMA) |  |  | 0.053 | 0.28 | 0.16 |  |
| Tan Pigment |  |  | 2.28 |  | 0.75 |  |
| TBBPA |  |  |  |  | 5.3 |  |
| EPON 829 |  |  |  |  | 5.3 |  |
| Gray Pigment |  |  |  |  |  | 1.6 |
| Core Sheets | Cotton Linters Paper | Fiber Glass Paper | Cotton Linters Paper | 7642 Glass Fabric | Cotton Linters Paper [pre-coated with melamine] | Cotton Linters Paper |
| Resin Content % | 61–64 | 83.3 | 62–65 | 46 | 63.2 | 46.8 |
| Squeeze Out % | 7–22 | 30–34 | 18–24 | 3–8 | 26–28 | 7–30 |
| Core Resin |  |  |  |  |  |  |
| Epoxy Resin EEW = 400 19% Bromine |  | 100 |  | 100 | 100 | 100 |
| Methyl Cellosolve |  | 6.8 |  | 7.1 |  | 7.1 |
| DMF |  | 6.8 |  | 7.1 |  | 7.1 |
| Dicyandiamide |  | 2 |  | 2.1 |  | 2.3 |
| TMG |  | 0.26 |  |  |  | 1.0 |
| Green Pigment |  | 0.7 |  | 0.31 |  |  |
| Hydrous Aluminum Silicate |  | 17 | 11.1 |  |  |  |
| Antimony Oxide | 6.7 | 0.34 | 8.9 |  | 6.8 | 5 |
| Oil Modified Phenolic | 100 |  | 100 |  |  |  |
| Epoxy Resin EEW = 500 21% Bromine | 53.1 |  | 53.1 |  |  |  |
| Water Soluble Phenolic | 8 |  | 8 |  |  |  |
| Acetone | 14 |  | 22 | 10.6 | 25.6 |  |
| TBBPA | 7.8 |  | 7.8 |  | 5.3 |  |
| Brown Pigment | 0.2 |  |  |  | (Tan) 0.75 |  |
| White Pigment | 0.6 |  | 0.6 |  |  |  |
| BDMA |  |  |  | 0.28 | 0.16 |  |
| Fumed Silicon Dioxide |  |  |  | 0.7 | 5.3 [Epon 829] |  |
| TMA |  |  |  |  | 10.2 |  |
| Gray Pigment |  |  |  |  |  | 1.6 |

TABLE 2

|  | Sample 1 | Sample 2 | Sample 3 | Sample 4 | Sample 5 | Sample 6 |
|---|---|---|---|---|---|---|
| Water Absorption % ASTM D229 D24/23 | 0.15 | 0.10 | 0.15 | 0.10 | 0.33 |  |
| Flexural Strength |  |  |  |  |  |  |
| Lengthwise psi ASTM D790 Crosswise psi | 53,000 | 55,000 | 48,000 | 80,000 | 25,000 |  |
|  | 34,000 | 40,000 | 36,000 | 65,000 | 23,000 |  |
| Flexural Modulus |  |  |  |  |  |  |
| Lengthwise psi | 2,500,000 | 2,400,000 | 2,400,000 | 2,800,000 | 1,400,000 |  |
| Crosswise psi | 2,000,000 | 2,000,000 | 1,900,000 | 2,500,000 | 1,200,000 |  |
| Izod Impact Lengthwise | 2.9 | 3.4 | 2.4 | 13.0 |  |  |
| Ft/Lb/In Crosswise | 1.8 | 2.2 | 1.8 | 10.0 |  |  |
| Flammability UL 94 | V-0 | V-0 | V-0 | V-0/V-1 | V-0 | V-0 |
| Dielectric Constant at MHz ASTM D150, D24/23 | 3.8 | 4.0 | 4.1 | 4.3 | 4.2 | Oven Blister 15 Min. at 400° F. |
| Dissipation Factor at 1 MHz ASTM D150, D24/23 | .029 | .024 | .027 | .019 | .030 | Pass |
| Dielectric Breakdown Parallel D48/50 Kv (kilovolts) | 74 | 68 | 70 | 65 | 75 |  |
| Perpendicular Electric Strength D48/50 ST Kv | 650 | 550 | 600 | 500 |  |  |
| Insulation Resistance EIA C96/35/90 Megohms | 7,000,000 | 1,000,000 | 5,000,000 | 1,000,000 | 5,000,000 |  |
| Surface Resistance C96/35/90 | 280,000 | 10,000,000 | 200,000 | 100,000,000 | 500,000 |  |
| Volume Resistance C90/35/90 | 2,000,000 | 5,000,000 | 1,000,000 | 4,000,000 | 1,000,000 |  |
| Yoke Track Art Resistance | Pass | Fail | Fail | Fail | Pass | Pass |
| Peel Strength Copper Foil 1″ Wide Cond. A lbs. | 9.0 | 9.5 | 9.0 | 10.0 | 9.0 |  |
| Peel after 20 Seconds at 500° F. | 8.5 | 9.5 | 8.5 | 10.0 | 9.0 | 9.2 |
| Solder Float to Blister |  |  |  |  |  |  |

TABLE 2-continued

|  | Sample 1 | Sample 2 | Sample 3 | Sample 4 | Sample 5 | Sample 6 |
|---|---|---|---|---|---|---|
| at 500° F. - Seconds | >60 | >60 | >60 | >60 | >60 | >60 |
| at 550° F. | 25 | >60 | 25 | >60 | | |

TABLE 3

|  | Sample 7 | Sample 8 | Sample 9 | Sample 10 | Sample 11 | Sample 12 | Sample 13 |
|---|---|---|---|---|---|---|---|
| Face Sheets | 7628 Glass Fabric | 7628 Glass Fabric | 7628 Glass Fabric | 7628 Glass Fabric | 7628 Glass Fabric | 7628 Glass Fabric | 7628 Glass Fabric |
| Resin Content % | 46.9 | 47.8 | 47.3 | 50.5 | 50.6 | 51.5 | 51.8 |
| Squeeze Out % | 14.0 | 17.2 | 11.6 | 17.4 | 7.2 | 24.8 | 15.2 |
| Face Resin |  |  |  |  |  |  |  |
| Epoxy Resin EEW = 400 19% Bromine (TBBPA) | 100 | 100 | 100 | 100 | 100 | 100 | 100 |
| Methyl Cellosolve | 6.8 | 6.8 | 6.8 | 6.8 | 6.8 | 6.8 | 6.8 |
| DMF | 6.8 | 6.8 | 6.8 | 6.8 | 6.8 | 6.8 | 6.8 |
| Dicyandiamide | 2 | 2 | 2 | 2 | 2 | 2 | 2 |
| TMG | 0.26 | 0.26 | 0.26 | 0.26 | 0.26 | 0.26 |  |
| DMP-30 |  |  |  |  |  |  | 0.26 |
| Antimony Oxide | 1.4 | 1.4 | 1.4 | 1.4 | 1.4 | 1.4 | 1.4 |
| Fumed Silicon Dioxide |  | 0.3 | 0.7 | 1.5 | 0.7 | 0.7 | 0.7 |
| White Pigment | 0.8 | 0.8 | 0.8 | 0.8 | 0.8 | 0.8 | 0.8 |
| Brown Pigment | 0.2 | 0.2 | 0.2 | 0.2 | 0.2 | 0.2 | 0.2 |
| Core Sheets | Cotton Linters Paper | Cotton Linters Paper | Cotton Linters Paper | Cotton Linters Paper | Cotton Linters Paper | Cotton Linters Paper | Cotton Linters Paper |
| Resin Content % | 61-64 |  |  |  |  |  |  |
| Squeeze Out % | 7-22 |  |  |  |  |  |  |
| Core Resin |  |  |  |  |  |  |  |
| Epoxy Resin EEW = 500 21% Bromine | 53.1 |  |  |  |  |  |  |
| Oil Modified Phenolic | 100 |  |  |  |  |  |  |
| Water Soluble Phenolic | 8 |  |  |  |  |  |  |
| Acetone | 14 |  |  |  |  |  |  |
| TBBPA | 7.8 |  |  |  |  |  |  |
| Antimony Oxide | 6.7 |  |  |  |  |  |  |
| White Pigment | 0.6 |  |  |  |  |  |  |
| Brown Pigment | 0.2 |  |  |  |  |  |  |
| Yoke Track Act Resistance | Fail | Fail | Pass | Fail | Pass | Fail | Fail |
| UL Flame Rating | V-0 | V-0 | V-0 | V-0 | V-0 | V-0 | V-0 |
| Total Burn Time | 24 | 11 | 18 | 16 | 10 | 18 | 7 |
| Peel After Solder Float | 8.8 | 8.0 | 8.8 | 9.2 | 9.6 | 9.2 | 8.4 |
| Solder Float at 550° F. | 2 | 7 | 8 | 13 | 15 | 13 | 14 |

PREPARATION OF FACE SHEETS

While it has been found that phenolic resin may be present in the resin admixture for impregnating the cores sheets, in accordance with the present invention, the face sheets are made by impregnating glass fiber cloth with a mixture containing no phenolic resin, but having a resin content consisting substantially entirely of brominated aromatic epoxy resin, having epoxide equivalent weight of 400, and in the range of 19% by weight of bromine. The preferred impregnating resin mixture for the face sheets is set forth as "Face Resin" in Table 1.

Prior U.S. Pat. No. 4,031,313 teaches that, to obtain high arc-resistance, the resin content of the face sheets, must not include greater than 30% aromatic ring-containing resin. It has been found that, according to this invention, the face sheets may be impregnated with a resin mixture containing substantially entirely brominated aromatic epoxy without sacrifice of high voltage-arc-resistance, provided certain other requirements are met for the impregnating resin and for the processing steps involved in the manufacture of the total laminate.

The first of these requirements relates to the other constituents of the resin mixture used for impregnating the face sheets. It is believed to be essential, to the successful carrying out of the manufacturing process of this invention, to control the mobility of the filled brominated epoxy resin impregnating the glass cloth of the face sheets of the substrate such that this resin mixture has relatively low mobility under the conditions of heat and pressure present during the final cure cycle. It has previously been noted that it is believed important to have core resin with relatively low mobility.

By this means, when the metallic foil and substrate are compressed under heat and pressure during the final cure cycle to bond the face and core sheets, the phenolic resin mixture of the core sheets is essentially confined to the core. The face sheets of glass cloth impregnated with low-mobility resin mixture act as barriers to prevent penetration by the phenolic resin mixture from the core through the glass cloth of the face sheets and blending of that phenolic resin mixture with the layers of filled brominated epoxy resin on the outer surface of the face sheets.

Referring to Table 1, the other constituents of the preferred impregnating resin of the face sheets will be seen to include methyl cellusolve and dimethyl formamide which are solvents, antimony oxide which is a flame retardant, pigments, fumed silicon dioxide, and dicyandiamide and tetramethylguanadine (TMG) which are curing agents and catalysts.

These solvents and agents are selected for their effect on viscosity, thixotropicity and drying time of the resin during the steps of impregnating the glass cloth and drying and B-staging the resin, to control the amount of resin add-on to the glass cloth and its mobility. Fumed silicon dioxide, which is heat stable and has very high insulation resistance, is believed to chemically combine with the epoxy and phenolic resin groups to form a heat resistant shield, and also is active as a thixotropic agent during the prepreg preparation and B-stage cure in controlling the amount of resin add-on and the uniformity of the coating, it being essential to provide a uniform coating on both surfaces of the glass cloth on passing the glass cloth through the liquid resin. These constituents, accordingly, are selected both for their contributions to the finished product and to the process, in particular to obtain the lower mobility desired for the face sheet resin during the final cure due to their effect on the flow characteristics of the face sheet resin under conditions of elevated temperature and pressure.

A series of laminate test samples were made to determine the effect of varying face sheet resin mobility and varying comcentration of fumed silicon dioxide in the face sheet resin formulation. The test results are summarized in Table 3, which also includes the data on one test sample (Sample 13) in which an aromatic catalyst was used instead of a non-aromatic catalyst which is preferred. Referring to Table 3, it will be seen that the test Sample 13 made using an aromatic catalyst failed the yoke high voltage arc resistance test.

The yoke track test results for three laminate examples on the squeeze out percent data in Table 3 also evidence that the resin mobility of the face sheet resin should be below 24.85 when phenolic resin is used for the core sheet resin. This was the squeeze out percent for Sample 12 which failed the yoke test. The preferred range of face sheet resin mobility when phenolic resin is used for the core sheet resin, as measured by squeeze out percent, is from about 7% to about 22%, as evidenced and confirmed by the tests reported on Table 3 and other tests.

Concerning concentration of fumed silicon dioxide, it is believed that this ingredient is essential in the face sheet resin where antimony oxide is present for its contribution to reducing flammability, but the concentration is apparently critical. As indicated in the data for Sample 9, 0.7 parts of fumed silicon dioxide in the resin formulation for the face sheet provided a laminate which passes the yoke test, but the concentration should be less than 1.25% (Sample 10, 1.5 parts), greater than 0.25% (Sample 9, 0.3 parts) and preferably in the range from about 0.5% to about 1% by weight.

In addition to their effect on mobility of the resin impregnating the face sheets, these constituents of the preferred resin used for impregnating face sheets serve other functions. For example, antimony oxide is an additive to improve flame retardancy and is considered essential for that purpose. It has been found, however, that antimony oxide tends to degrade high voltage arc resistance. Notwithstanding this tendency, antimony oxide is an essential ingredient to improve flame retardancy.

The curing agents listed in Table 1 for the Face Resin are dicyandiamide and tetramethylguanidine. These are recognized curing agents and catalytic agents for tetrabromobisphenol-A based epoxy resins of the kind preferred for the face sheet resin, providing latency at room temperature and rapid cures at elevated temperatures, particularly suitable for manufacture of laminates. These agents contain no aromatic groups and no hetrocyclic rings containing conjugated double bonds. It has been found that the use of such agents is significant when antimony oxide is utilized, recognizing its tendency to degrade arc resistance, to raise arc resistance of the laminate above acceptable or "pass" levels as determined by the yoke test.

The second of these other requirements believed to be essential in the manufacture of laminates having high arc resistance relates to the processing steps in the preparation of the dry prepregs to be used for face sheets. In preparing these dry prepregs, in accordance with the preferred embodiment of this invention, woven glass cloth (grade 7628-plain weave, 6 oz/yd$^2$) treated with silane for improved resin adherency, is passed into an impregnating tank containing the liquid resin formulation set forth as the Face Resin in Table 1, Column 1 at an elevated temperature. The impregnated glass cloth is passed through squeeze rolls to control add-on and into a drying oven (oven temperature 160°–170° C.) to remove volatiles and cure the resin to a "B" stage level. The resin content, including additives, of the dry prepreg preferably is in the range from 38% to 55% by weight, most preferred about 50%.

Mobility of the filled brominated epoxy resin impregnating the glass cloth of the face sheets of the laminate is controlled in the preparation of the face sheet prepregs, by varying the temperature of the drying oven, the speed at which the glass cloth is passed through the oven, or both speed and temperature. In a system involving horizontal movement of the glass cloth through the oven, typical operating conditions are temperatures of between 160°–170° C. and speed of 15–25 F.P.M. These parameters of time and temperature, together with the selection of the constituents, determine the mobility of resin impregnating the glass cloth after passing through the oven and the rolls.

Flow characteristics, i.e., mobility of the resin under heat and pressure, is measured by a "squeeze-out test" conducted as follows: five 4" square sheets of the dry prepreg are laid up and pressed at a pressure of 4800 psi, and a temperature of 320° F. for five minutes. After the stack is allowed to cool, the resin which has been squeezed out and projects beyond the edges of the glass cloth is cut free, weighed and compared with the total resin content to determine the "squeeze out %". Preferably the squeeze out percent is between 7%–22% for both the core sheets and face sheets. This is a relatively low mobility factor, particularly for the face sheets, compared with mobility factors for resin of face sheets of other commercial laminates known to applicant.

PREPARATION OF PRINTED CIRCUIT BOARD LAMINATE

Referring to FIG. 2, in the manufacture of the laminate in accordance with this invention, both the dried face sheet prepregs and the dried core sheet prepregs are cut to size for lay-up into copper-clad substrates. Cut to size core sheet prepregs are assembled, the number of such core sheet prepregs depending on the required finished thickness for the printed circuit board laminate. The more commonly used thicknesses are 0.031, 0.047 and 0.062 inches; requiring one, two or three core sheet prepregs, respectively.

With the core sheet prepregs, face sheet prepregs are assembled to form outer layers of the substrate along with copper foil in the arrangement illustrated in FIG. 2. The lay-up is then placed between steel plates or press pans (shown schematically in FIG. 2) and the composite is then compressed at specified heat and pressure in a laminating press. The typical press cure for a 0.062 inch thick laminate is about 35–45 minutes at 160° C. at about 500 psi pressure.

It is customary to test printed circuit board laminates for other electrical and chemical properties besides arc resistance by subjecting sample laminates to certain standard tests. In order to provide test results for an illustrative laminate constructed in accordance with this invention, tests were conducted on 0.062" printed circuit board laminate with one ounce/foot$^2$ copper foil bonded to one side, test results being set forth in Column 1 of Table 2.

COMPARISON OF INVENTION WITH PRIOR ART LAMINATES

In Table 1 and Table 2 are resin formulations for face sheets and core sheets and properties, of prior art laminates known to applicant. Of the six laminates covered by the tables, only the laminates of this invention Samples 1 and 6 and the prior art laminate Sample 5, consistently pass the high voltage arc-resistance test described above and identified as "yoke track arc resistance" in Table 2.

Referring to Table 1, it will be seen that Sample 5 is made entirely of resin impregnated cotton linter paper sheets. From Table 2 it will be seen that the laminate of Sample 5 has relatively low strength and flexibility, as would be expected for a lower cost, paper based laminate. Table 1 also reveals that the sheets for the Sample 5 laminate initially are precoated with a melamine resin, recognized in the prior art as a contributor to high voltage arc resistance. Compared with the laminates of Samples 1 and 6 constructed according to this invention, Sample 5 would not be a satisfactory product for yoke circuit printed circuit boards because of its relatively poor physical properties.

Sample 2 is a relatively high-cost laminate compared with the Samples 1 and 6 laminates of this invention. Referring to Table 1, the higher cost as compared with Sample 1 is attributable to use of fiberglass paper for the core sheets and of substantially higher cost brominated epoxy for the core sheet impregnating resin. Even though it is a higher cost laminate compared with Samples 1 or 6, the Sample 2 laminate would not be as satisfactory a product for yoke circuit printed circuit boards because it does not consistently pass the high voltage arc resistance test. It will be observed from Table 1 that the face sheets of the laminate Sample 2 have an impregnating resin with essentially the same formulation as the face resin of Sample 1, but the face resin of Sample 2 has a higher mobility, i.e., flow characteristics of the resin coating, which is believed to be a factor affecting its relatively poorer high voltage arc-resistance characteristics.

Referring to Sample 3, this is a forerunner of the laminate of this invention, and has been used for yoke circuit boards. However, it does not consistently pass the high voltage arc-resistance test, and prior to this invention it was not known how to improve the arc-resistance properties of this type of printed circuit board laminate. It will be seen from Table 1 that the Sample 3 laminate has face sheets impregnated with brominated epoxy cured by the action of aromatic curing agents. Furthermore, the face sheet resin of the Sample 3 laminate has relatively higher mobility, compared with the face sheet resin of samples of this invention. Sample 3 is not as satisfactory a product for use in fabricating yoke printed circuit boards as Samples 1 or 6, because it does not consistently pass the high voltage arc-resistance test.

The Sample 4 laminate includes entirely resin impregnated glass cloth sheets, and the resin for both the cure sheets and face sheets is substantially entirely brominated epoxy. Accordingly, this laminate is a relatively high cost produced compared with the Samples 1 or 6 laminate of this invention. The Sample 4 laminate does not consistently pass the high voltage arc-resistance test, and for this reason is not as satisfactory a product as this invention for use in fabricating yoke circuit boards. It will be seen from Table 1 that the formulation for the face resin of Sample 4 is essentially entirely brominated epoxy with a curing agent of dicyandiamide, and BDMA instead of TMG as a catalyst. The mobility of the face resin is higher than preferred. These differences as compared with the face resin of Sample 1, are believed to explain the relatively poor high voltage arc-resistance characteristics of the Sample 4 laminate.

VARIATIONS IN THE PREFERRED MATERIALS AND FORMULATIONS FOR LAMINATE MANUFACTURE

The preferred formulations and materials for laminates constructed according to the invention are given in Table 1, as Sample 1. It is recognized, however, variations may be made without departing from the invention.

Thus, for the face sheets, it is preferred to use woven glass cloth grade 7628; however, glass fabrics of other structures, weave patterns and weights may be used depending on the application for the printed circuit boards. Cost is an important factor in laminate manufacture. To reduce costs, cotton linter paper is preferred for the core sheets; however, other cellulosic papers or papers of mixtures of natural fibers and synthetic fibers may be used for the core sheets of the printed circuit laminate. Also, for cost reasons, it is preferred to use a major amount of phenolic resin for the core sheets; however, other resins commonly used in the manufacture of core sheets for printed circuit board substrates may be used. As indicated in Table 1 the phenolic resin for the preferred core sheet resin is oil modified, which imparts a degree of flexibility to the cured resin and facilitates room temperature punching of the printed circuit board laminate. However, other phenolic resins, epoxy resins and other types of resins may be used for the core sheets when such provide the requisite structural, electrical and chemical properties in the finished laminate at a satisfactory cost for the intended use.

With regard to the formulation for the face sheet resin, it is preferred to use 60–85 percent by weight brominated aromatic epoxy resin solids (EEW-400, 19% bromine), 1.5–4 percent by weight dicyandiamide, 1–5 percent by weight antimony oxide, about 0.5–1.0 percent by weight fumed silicon dioxide, about 0.1–0.5 percent by weight amine catalyst (i.e. TMG), about 1.0–2.0 percent by weight pigments. However, the pigments are optional, and while brown pigment (ferrous oxide) is listed in the formulation for Sample 1 in Table 1, it has been observed that the presence of ferrous oxide tends to degrade high voltage arc resistance and such material is, therefore, not preferred and is optional. It is also optional to include additional ingredients such as fillers, e.g., hydrous aluminum silicate 5–20 percent by weight.

With regard to the formulation for the core sheet resin, it is preferred to use about 30–60 percent by weight of oil modified phenolic resin solids, about 20–40 percent by weight of brominated epoxy resin solids, EEW-500, 21% bromine, 2–6 percent by weight of water soluble phenolic resin solids, 2–10 percent by weight antimony oxide, 3–10 percent by weight tetrabromobisphenol-A (i.e., TBBPA), 0.1–0.5 percent by weight iron oxide pigment and 0.3–1.0 percent titanium dioxide pigment.

HIGH TEMPERATURE RESISTANT LAMINATE

However, it has been found that a high temperature resistant laminate may be provided by utilizing epoxy resin for the core sheet resin and using no phenolic resin for curing agent as in the preferred embodiment. High temperature resistance is measured by making a laminate sample 8" square with copper foil on one or both surfaces, placing the sample in a forced air oven which is capable of rapidly raising the temperature of the sample to the test temperature, leaving the sample in the oven for a test period, illustratively 8 or 15 minutes, then removing the sample and examining it for blisters on the surfaces or edges in the foil or resin. Thus, an alternative high temperature form of laminate constructed in accordance with this invention is identified as Sample 6 in Table 1. As there indicated, the face sheet construction is the same as for Sample 1. For the core sheet, however, in place of phenolic resin, dicyandiamide is utilized as curing agent and TMG (tetramethylguanadine) which is an aliphatic tertiary amine as a catalyst in an amount greater than might be considered necessary for such purposes. The greater proportion is required because the water/alcohol pre-treatment apparently interferes with the curing reaction. The water/alcohol pretreatment is utilized to obtain better penetration of resin into the fibrous structure of the core sheet, to improve electrical properties and provide resin impregnation to prevent high water absorption. But, with the water pretreatment impairing the reaction when dicyandiamide is used as the curing agent, increasing the amount of curing agent and catalyst enables a rapid resin cure with good penetration into the core sheet, and results in a laminate with high temperature resistance as well as high voltage arc resistance and commercially acceptable mechanical and electrical properties.

The properties of Sample 6 laminates are given in Table 2 which includes "pass oven blister 15 min. at 400° F." which refers to the high temperature test above-described, where the oven temperature is maintained at 400° F. and the test sample is left in the oven for 15 minutes. Another high temperature test is laelled "60 sec. solder float at 500° F.". In this test, simulating wave solder processing, a 2"×2" test sample is floated on liquid solder for sixty seconds at the temperature indicated and the sample is then inspected for delamination, blistering or peeling. Laminates constructed with the formulations for face and core sheet resins as set forth for Sample 6 have consistently passed solder float tests at 550° F. and 575° F., evidencing excellent high temperature resistance.

Although the subject invention has been described by reference to preferred embodiments, it will be apparent that many other modifications could be devised by those skilled in the art that would fall within the spirit and scope of the present invention as defined by the appended claims.

What is claimed is:

1. A high voltage and high temperature arc-resistant laminate for printed circuit boards of the type having a substrate and metallic foil bonded on one or both surfaces of said substrate, said substrate including core sheets of cellulosic paper impregnated with a resin formulated from a composition including a major amount of brominated epoxy resin solids, minor amounts of dicyandiamide and amine catalyst, antimony oxide and pigments, and a face sheet adjacent said metallic foil, said face sheet comprising glass fiber cloth impregnated with a resin formulated from a composition containing a major amount of brominated aromatic epoxy resin solids, and minor amounts of dicyandiamide curing agent and amine catalyst, said catalyst containing no aromatic groups and no heterocyclic rings containing conjugated double bonds, together with minor amounts of antimony oxide, fumed silicon dioxide, and pigments.

2. A high voltage arc-resistant laminate for printed circuit boards of the type having a substrate and metallic foil bonded on one or both surfaces of said substrate, said substrate including core sheets of cellulosic paper impregnated with a resin formulated from a composition including a major amount of brominated epoxy resin solids and curing agents or brominated epoxy resin and phenolic resin solids, and a face sheet adjacent said metallic foil, said face sheet consisting of glass fiber cloth impregnated with a resin formulated from a composition comprising 60 to 85 percent by weight brominated aromatic epoxy resin solids, about 1.5 to 4 percent by weight dicyandiamide, about 1 to 5 percent by weight antimony oxide, about 0.5 to 1.0 percent by weight fumed silicon dioxide, about 0.1 to 0.5 percent by weight amine catalyst, about 0.1 to 2 percent pigment.

3. A high voltage arc-resistant laminate according to claim 2 which is also high temperature resistant wherein said core sheet resin formulation comprises a major amount of brominated aromatic epoxy resin solids, and minor amounts of dicyandiamide curing agent, amine catalyst, antimony oxide and pigments.

4. A high voltage arc-resistant laminate for printed circuit boards of the type having a substrate and metallic foil bonded on one or both surfaces of said substrate, said substrate including core sheets of cellulosic paper impregnated with a resin formulated from a composition including a major amount of a phenolic or epoxy resin, and a face sheet adjacent said metallic foil, said face sheet comprising glass fiber cloth impregnated with a resin formulated from a composition containing about 60 to 85 percent by weight brominated aromatic epoxy resin solids polymerized with minor amounts of a curing agent and an amine catalyst, said curing agent and catalyst each containing no aromatic groups and no heterocyclic rings containing conjugated double bonds, together with minor amounts of antimony oxide and fumed silicon dioxide.

5. A high voltage arc-resistant laminate for printed circuit boards of the type having a substrate and metallic foil bonded on one or both surfaces of said substrate, said substrate including core sheets of cellulosic paper impregnated with a resin formulated from a composition consisting of 30 to 60 percent by weight of oil modified phenolic resin solids, 20 to 40 percent by weight of brominated epoxy resin solids, 2 to 6 percent by weight of water soluble phenolic resin solids, 2 to 10 percent by weight antimony oxide, 3 to 10 percent by weight tetrabromobisphenol-A, 0.1 to 2 percent by weight pigment; and a face sheet adjacent said metallic foil, said face sheet comprising glass fiber cloth impregnated with a resin formulated from a composition containing about 60 to 85 percent by weight brominated aromatic epoxy resin solids polymerized with minor amounts of dicyandiamide and an amine catalyst, said catalyst containing no aromatic groups and no heterocyclic rings containing conjugated double bonds, together with about 1 to 5 percent by weight antimony oxide and about 0.5 to 1.0 percent by weight fumed silicon dioxide.

* * * * *